(12) United States Patent
Wang

(10) Patent No.: US 9,565,784 B2
(45) Date of Patent: Feb. 7, 2017

(54) ELECTRONIC DEVICE WITH FAN FOR DISSIPATING HEAT

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventor: Dong-Bo Wang, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/694,786

(22) Filed: Apr. 23, 2015

(65) Prior Publication Data

US 2016/0309615 A1    Oct. 20, 2016

(30) Foreign Application Priority Data

Apr. 14, 2015    (CN) .......................... 2015 1 0174449

(51) Int. Cl.
   *H05K 7/20*    (2006.01)

(52) U.S. Cl.
   CPC ................................ *H05K 7/20145* (2013.01)

(58) Field of Classification Search
   CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
   USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
   See application file for complete search history.

(56) References Cited

U.S. PATENT DOCUMENTS

| 5,926,367 | A  | * | 7/1999  | Gutierrez | ................ | G06F 1/189 |
|           |    |   |         |           |                  | 361/695    |
| 6,537,019 | B1 | * | 3/2003  | Dent      | ................ | F04D 25/166|
|           |    |   |         |           |                  | 361/679.48 |
| 6,565,334 | B1 | * | 5/2003  | Bradbury  | ................ | F04D 29/384|
|           |    |   |         |           |                  | 361/695    |
| 2004/0228086 | A1 | * | 11/2004 | Lin     | ................ | G06F 1/203 |
|           |    |   |         |           |                  | 361/679.48 |
| 2006/0039110 | A1 | * | 2/2006 | Foster   | ................ | F04D 19/007|
|           |    |   |         |           |                  | 361/697    |
| 2007/0131409 | A1 | * | 6/2007 | Asahi    | ................ | G05D 23/19 |
|           |    |   |         |           |                  | 165/287    |
| 2007/0207721 | A1 | * | 9/2007 | Chang    | ................ | H05K 7/20209|
|           |    |   |         |           |                  | 454/184    |
| 2009/0086430 | A1 | * | 4/2009 | Kang     | ................ | G02F 1/133385|
|           |    |   |         |           |                  | 361/695    |
| 2010/0134976 | A1 | * | 6/2010 | Kuo      | ................ | G06F 1/203 |
|           |    |   |         |           |                  | 361/695    |

(Continued)

*Primary Examiner* — Anthony Haughton
*Assistant Examiner* — Razmeen Gafur
(74) *Attorney, Agent, or Firm* — Zhigang Ma

(57) ABSTRACT

An electronic device includes a shell, a thermal element, a controller and a fan. The shell defines a first air outlet and a second air outlet. The controller controls the fan to rotate clockwise to generate a first air current to dissipate the heat generated by the thermal element out of the first air outlet in a first preset condition, and control the fan to rotate anti-clockwise to generate a second air current to dissipate the heat generated by the thermal element out of the second air outlet in a second preset condition.

13 Claims, 3 Drawing Sheets

(56) References Cited

U.S. PATENT DOCUMENTS

| | | | | |
|---|---|---|---|---|
| 2010/0157522 A1* | 6/2010 | Refai-Ahmed | ........... | G06F 1/20 |
| | | | | 361/679.54 |
| 2011/0130891 A1* | 6/2011 | Nielsen | ................ | G06F 1/206 |
| | | | | 700/300 |
| 2011/0159795 A1* | 6/2011 | Sprague | ............. | H05K 7/20181 |
| | | | | 454/184 |
| 2011/0176118 A1* | 7/2011 | Wu | ........................ | G03B 21/16 |
| | | | | 353/61 |
| 2011/0222243 A1* | 9/2011 | Nagami | ............... | B23K 9/1006 |
| | | | | 361/697 |
| 2011/0235272 A1* | 9/2011 | Bash | .................. | H05K 7/20609 |
| | | | | 361/692 |
| 2012/0020017 A1* | 1/2012 | Kehret | .................... | G06F 1/183 |
| | | | | 361/679.54 |
| 2012/0026677 A1* | 2/2012 | Bhutani | ............... | F04D 25/0613 |
| | | | | 361/679.48 |
| 2012/0155024 A1* | 6/2012 | Yamaguchi | .......... | H05K 7/2029 |
| | | | | 361/692 |
| 2013/0100606 A1* | 4/2013 | Wang | ................... | F04D 27/004 |
| | | | | 361/679.48 |
| 2013/0120935 A1* | 5/2013 | Huang | ..................... | G06F 1/20 |
| | | | | 361/695 |
| 2014/0098493 A1* | 4/2014 | Chen | .................. | H05K 7/20127 |
| | | | | 361/692 |
| 2014/0104783 A1* | 4/2014 | Yang | ........................ | G06F 1/20 |
| | | | | 361/679.47 |
| 2014/0118926 A1* | 5/2014 | Santos | ...................... | G06F 1/20 |
| | | | | 361/679.48 |
| 2014/0211411 A1* | 7/2014 | Slaby | ................. | H05K 7/20745 |
| | | | | 361/679.46 |
| 2014/0376177 A1* | 12/2014 | Lin | .................... | G05D 23/1919 |
| | | | | 361/679.48 |

* cited by examiner

ELECTRONIC DEVICE WITH FAN FOR DISSIPATING HEAT

CROSS-REFERENCE TO RELATED APPLICATIONS

This application claims priority to Chinese Patent Application No. 201510174449.4, filed on Apr. 14, 2015 the contents of which are incorporated by reference herein.

FIELD

The subject matter herein relates to electronic devices, especially relates to a electronic devices with a fan for dissipating heat generated by the electronic device during operation.

BACKGROUND

Electronic devices, for example computers, generate heat during operation. The electronic device includes a fan to dissipate the heat. The fan rotates at a single direction increasing the temperature of the air outlet.

BRIEF DESCRIPTION OF THE DRAWINGS

Implementations of the present technology will now be described, by way of example only, with reference to the attached figures.

DETAILED DESCRIPTION

Figure 1:
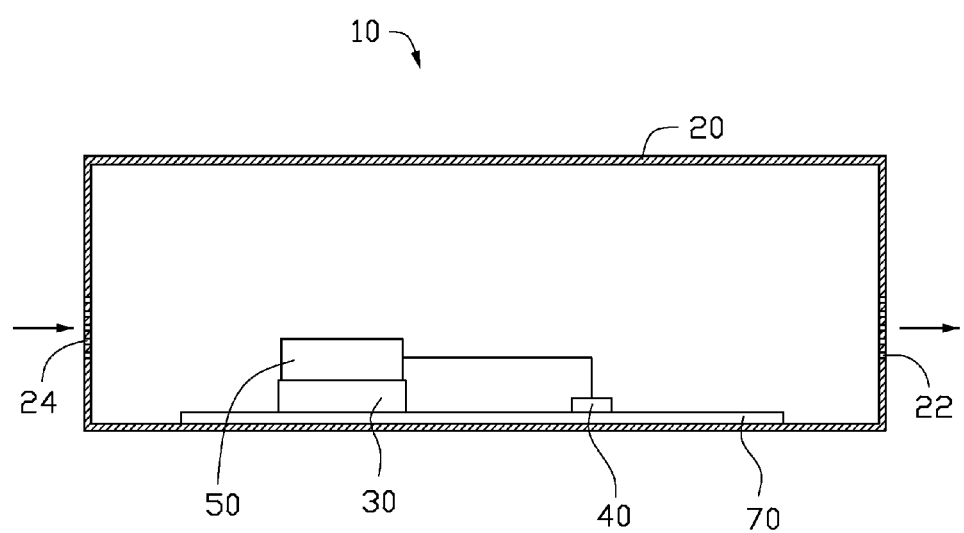
FIG. 1 is a diagrammatic view of an electronic device with a air current in a first direction, according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like.

Figure 2:
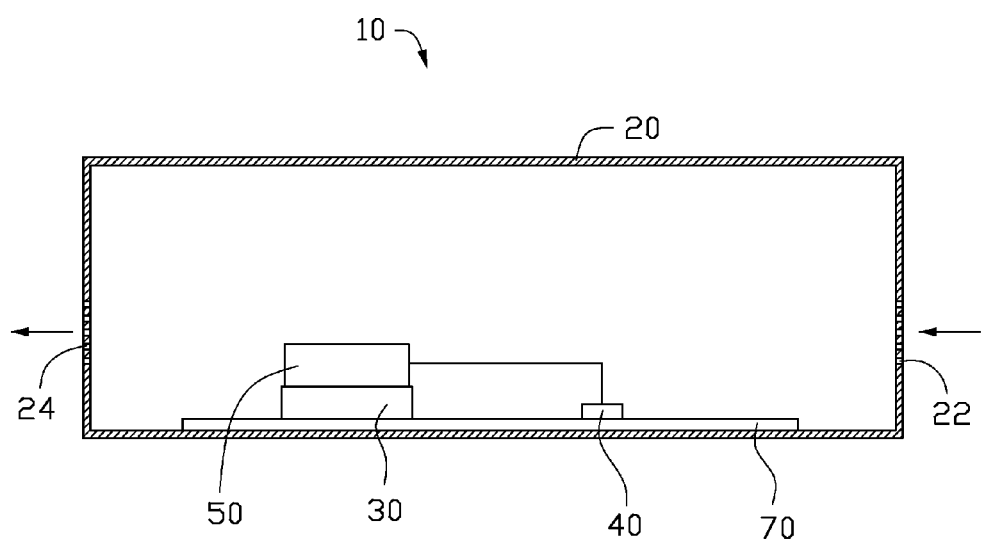
FIG. 2 is similar to FIG. 1, but with the air current in a second direction.

FIG. 1 illustrates an electronic device 10 includes a shell 20, a thermal element 30, a controller 40 and a fan 50. The shell 20 defines a first air outlet 22 and a second air outlet 24. The thermal element 30, the controller 40 and the fan 50 are all attached in the shell 20. The controller 40 electrically connects to the fan 50. FIGS. 1 and 2 illustrate that the controller 40 is configured to control the fan 50 to rotate clockwise to generate a first air current to dissipate the heat generated by the thermal element 30 out of the first air outlet 22 in a first preset condition, and control the fan 50 to rotate anticlockwise to generate a second air current to dissipate the heat generated by the thermal element 30 out of the second air outlet 22 in a second preset condition. In an embodiment, the electronic device 10 is a notebook computer.

The electronic device 10 further includes cooling fins 60. The cooling fins 60 are positioned on the thermal element 30. The fan 50 is positioned on the cooling fins 60. The thermal element is a central processing unit electrically connected to the motherboard 70 of the electronic device 10. The controller 40 electrically connects to the motherboard 70. The first air outlet 22 is opposite to the second air outlet 24. The first air current and the second air current are flowing in opposite directions.

In one embodiment, the controller 40 controls the fan 50 to periodically rotate clockwise and anticlockwise. When an anticlockwise rotation time of the fan 50 reaches a first preset time, the controller 40 controls the fan 50 to rotate clockwise to generate the first air current to dissipate the heat generated by the thermal element 30 out of the first air outlet 22. When a clockwise rotation time of the fan 50 reaches a second preset time, the controller 40 controls the fan 50 to rotate anticlockwise to generate the second air current to dissipate the heat generated by the thermal element 30 out of the second air outlet 24. The controller 40 further controls the fan 50 to rotate clockwise when the electronic device 10 starts to work. In an embodiment, the thermal element 30 is closer to the first air outlet 22; the first preset time is greater than the second preset time. In another embodiment, the first preset time is equal to the second preset time.

Figure 3:
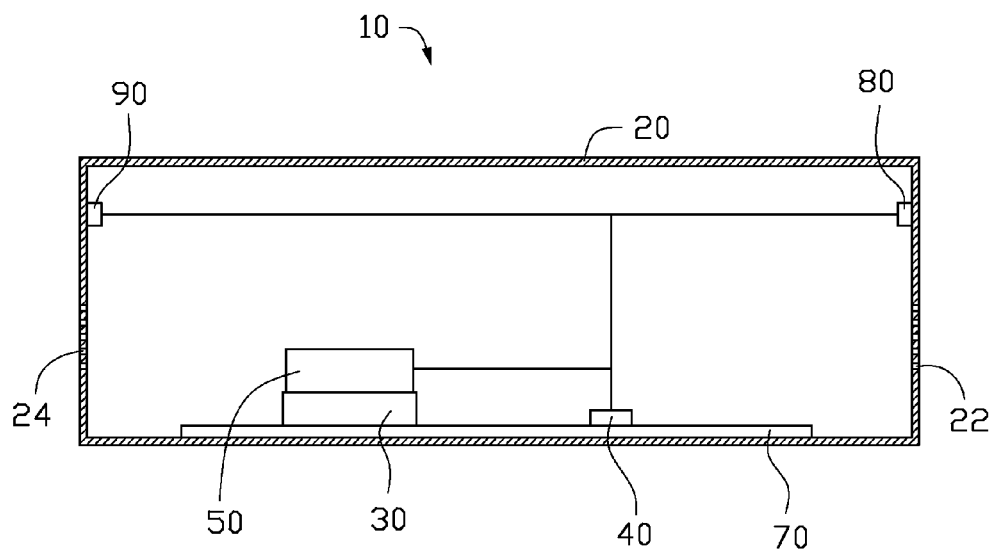
FIG. 3 is a diagrammatic view of an electronic device, according to another embodiment.

FIG. 3 illustrates, in another embodiment, the electronic device 10 further includes a first temperature sensor 80 and a second temperature sensor 90. The first temperature sensor 80 is attached to the inner surface of the shell 20 adjacent to the first air outlet 22. The first temperature sensor 80 is configured to sense the temperature of the first air outlet 22. The second temperature sensor 90 is attached to the inner surface of the shell 20 adjacent to the second air outlet 24. The second temperature sensor 90 is configured to sense the temperature of the second air outlet 24. The first temperature sensor 80 and the second temperature sensor 90 electrically connect to the controller 40. When the temperature of the second air outlet 24 reaches a first preset temperature, the controller 40 controls the fan 50 to rotate clockwise to generate the first air current to dissipate the heat generated by the thermal element 30 out of the first air outlet 22. When the temperature of the first air outlet 22 reaches a second preset temperature, the controller 40 controls the fan 50 to rotate anticlockwise to generate the second air current to dissipate the heat generated by the thermal element 30 out of the second air outlet 24. In an embodiment, the thermal element 30 is closer to the first air outlet 22; the first preset temperature time is greater than the second temperature time. In another embodiment, the first preset temperature is equal to the second preset temperature.

The embodiments shown and described above are only examples. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. An electronic device comprising:
   a shell having a first air outlet and a second air outlet defined therein;
   a first temperature sensor for sensing the temperature of the first air outlet;
   a second temperature sensor for sensing the temperature of the second air outlet;
   a thermal element attached in the shell;
   a fan positioned in the thermal element; and
   a controller; when the temperature of the second air outlet reaches a first preset temperature, the controller controls the fan to rotate clockwise to generate a first air current to dissipate the heat generated by the thermal element out of the first air outlet, and when the temperature of the first air outlet reaches a second preset temperature, the controller controls the fan to rotate anticlockwise to generate a second air current to dissipate the heat generated by the thermal element out of the second air outlet.

2. The electronic device as claimed in claim 1, wherein the first preset temperature is equal to the second preset temperature.

3. The electronic device as claimed in claim 1, wherein the thermal element is closer to the first air outlet, the first preset temperature is greater than the second temperature time.

4. The electronic device as claimed in claim 1, wherein the first temperature sensor is attached to the inner surface of the shell adjacent to the first air outlet, the second temperature sensor is attached to the inner surface of the shell adjacent to the second air outlet.

5. The electronic device as claimed in claim 1, wherein the first air outlet is opposite to the second air outlet.

6. An electronic device comprising:
   a shell defining a first air outlet and a second air outlet;
   a first temperature sensor for sensing the temperature of the first air outlet;
   a second temperature sensor for sensing the temperature of the second air outlet;
   a thermal element attached in the shell;
   a fan positioned on the thermal element;
   a controller; when the temperature of the second air outlet reaches a first preset temperature the controller controls the fan to rotate in a first direction to generate a first air current to dissipate the heat generated by the thermal element out of the first air outlet, and when the temperature of the first air outlet reaches a second preset temperature, the controller controls the fan to rotate in a second direction the reverse of the first direction to generate a second air current to dissipate the heat generated by the thermal element out of the second air outlet.

7. The electronic device as claimed in claim 6, wherein the first preset temperature is equal to the second preset temperature.

8. The electronic device as claimed in claim 6, wherein the thermal element is closer to the first air outlet, the first preset temperature is greater than the second temperature time.

9. The electronic device as claimed in claim 6, wherein the first temperature sensor is attached to the inner surface of the shell adjacent to the first air outlet, the second temperature sensor is attached to the inner surface of the shell adjacent to the second air outlet.

10. The electronic device as claimed in claim 6, wherein the first air outlet is opposite to the second air outlet.

11. An electronic device comprising:
    a shell having a first air outlet and a second air outlet defined therein;
    a thermal element attached in the shell;
    a fan positioned in the thermal element; and
    a controller configured to control the fan to rotate, when a period of anticlockwise rotation of the fan reaches a first preset time, the controller controls the fan to rotate clockwise to generate a first air current to dissipate the heat generated by the thermal element out of the first air outlet, and when a period of clockwise rotation of the fan reaches a second preset time, the controller controls the fan to rotate anticlockwise to generate a second air current to dissipate the heat generated by the thermal element out of the second air outlet.

12. The electronic device as claimed in claim 11, wherein the first preset time is equal to the second preset time.

13. The electronic device as claimed in claim 11, wherein the thermal element being closer to the first air outlet, the first preset time is greater than the second preset time.

* * * * *